United States Patent [19]
Taylor, Jr.

[11] Patent Number: 5,485,008
[45] Date of Patent: Jan. 16, 1996

[54] LOW MAGNIFICATION GAS LIMITING APERTURE ASSEMBLY FOR ELECTRON MICROSCOPY DEVICES

[75] Inventor: Myron E. Taylor, Jr., Brookeville, Md.

[73] Assignee: University of Maryland, College Park, College Park, Md.

[21] Appl. No.: 264,271

[22] Filed: Jun. 23, 1994

[51] Int. Cl.$^6$ ............................ H01J 37/04; H01J 37/244
[52] U.S. Cl. ............................................. 250/310; 250/307
[58] Field of Search ..................................... 250/310, 307

[56] References Cited

U.S. PATENT DOCUMENTS

| | | | |
|---|---|---|---|
| 4,785,182 | 11/1988 | Mancuso et al. | 250/310 |
| 4,823,006 | 4/1989 | Danilatos et al. | 250/310 |
| 5,198,675 | 3/1993 | Hikita et al. | 250/310 |
| 5,250,808 | 10/1993 | Dantilos et al. | 250/310 |

Primary Examiner—Bruce C. Anderson
Attorney, Agent, or Firm—Christopher N. Sears

[57] ABSTRACT

The present invention pertains to scanning electron microscope devices with an improved design that allows for lower magnification capabilities without signal degradation. In particular, the design improvement is in the aperture carrier for the electron detector/differential pumping system therein. Advantages of this improvement include shorter working distances of a specimen under examination to obtain the same magnification for prior art type ESEM apparatus, lower magnification capabilities of an ESEM apparatus, better signal/noise ratio of the specimen and higher chamber pressures in which the specimen can be examined. Other features of the invention herein includes use of a variable displacement mount for holding the sample using a piston design which allows for variable detector positioning with respect to the specimen.

18 Claims, 4 Drawing Sheets

5,485,008

LOW MAGNIFICATION GAS LIMITING APERTURE ASSEMBLY FOR ELECTRON MICROSCOPY DEVICES

FIELD OF THE INVENTION

This invention pertains to electron microscopy devices. In particular, the invention is an improvement in the method and means for detecting radiation by a scanning electron microscope.

BACKGROUND OF THE INVENTION

Known techniques for scanning electron microscopes includes U.S. Pat. No. 5,250,808 invented by Danilatos et al. entitled "Integrated Electron Optical/Differential Pumping/Imaging Signal System For An Environmental Scanning Electron Microscope" that is owned by Electroscan Inc. is hereby incorporated by reference. This reference teaches of a gaseous environmental electron microscope (ESEM) in which the present invention makes improvements upon which can also be used in other electron microscopy devices. In particular, the improvements are of the dual aperture carrier and secondary electron imaging detector assembly as shown in FIG. 1 herein which is also disclosed by this reference. Held within the assembly are two apertures for differential pumping. When a bottom aperture is greater than 2.0 mm, vacuum within the ESEM chamber degrades dramatically. Smaller bottom apertures limit the degree of allowable lower magnification. The improvement presented herein allows magnification below 20X without vacuum failure. Another deficiency with this prior art ESEM apparatus includes the imaging detection hardware that is used for detecting secondary electrons that strike the back of the detector. This detector design induces extraneous noise in the detected signal of the examined specimen.

Another prior art references that encompass the present invention includes U.S. Pat. No. 4,785,182 invented by Mancuso et al. entitled "Secondary Electron Detector For Use in A Gaseous Atmosphere" which is also incorporated by reference. This reference teaches the conceptual method and means to implement U.S. Pat. No. 5,250,808 discussed above. However, this teaching does not discuss a method or means that allows for lower magnification capabilities in ESEM apparatus.

Another teachings that bears upon the U.S. Pat. No. 4,785,182 and is discussed that patent and appears to limit the type of allowable detection schemes for ESEH apparatus is the article by Danilatos entitled "A Gaseous Detector Device for the Environmental SEH" in Micron and Microscopa Acta, Vol. 14(4), (1983), pp. 307–318. This article states ". . . it was not possible to obtain secondary electron image for a direct comparison. Alternatively some sort of trajectory contrast might be present." This statement infers that the images derived from ESEH apparatus were secondary electrons (SE), backscatter electrons (BSE), a combination of both SE and BSE, absorbed current, or yet another method of signal detection. In the U.S. Pat. No. 4,785,182, its' disclosure restricts the means of electron detection by the detector to only secondary electrons. However, since that teaching discloses only detectors with direct line-of-sight with the examined specimen, one can infer that other types of electrons such as BSE are being detected as well. Thus, the present invention allows for other types of detector schemes in a ESEH type SEM.

SUMMARY OF THE INVENTION

The present invention pertains to a scanning electron microscope with an improved design that allows for lower magnification capabilities without signal degradation. In particular, the design improvement is in the aperture carrier for the electron detector/differential pumping system therein. Advantages of this improvement include shorter working distances of a specimen under examination to obtain the same magnification for prior art type ESEM apparatus, lower magnification capabilities of an ESEM apparatus, better signal/noise ratio of the specimen and higher chamber pressures in which the specimen can be examined. Other features of the invention herein includes use of a variable displacement mount for holding the sample using a piston design which allows for variable detector positioning with respect to the specimen.

OBJECTS OF THE INVENTION

Accordingly, several objects and advantages of the present invention are:

(a) To provide a method for a gaseous ESEM detector as well as other EM apparatus that allows for lower magnification of a specimen under examination.

(b) To provide a device that is part of an ESEM in particular and SEM devices in general and apparatus that allows for these lower magnification.

(c) To provide a device that allows for a shorter working distance to achieve low magnification between the electron detector and specimen under examination of an ESEM apparatus without signal degradation.

(d) To provide a device that allows for a shorter working distance between the electron detector and the examined specimen at lower magnifications when compared to known ESEM apparatus.

Still further advantages will become apparent from a consideration of the ensuing detailed description.

LIST OF FIGURES

FIG. 1 shows a prior art dual aperture carrier and secondary electron imaging detector assembly as shown in U.S. Pat. No. 5,250,808.

FIG. 2 which is prior art shows a representative cross section of FIG. 1.

REFERENCE NUMERALS IN THE DRAWINGS

1 Seal
2 Top Aperture
3 Pumping Ports
4 Body of Aperture Carrier Assembly
5 Insulator
6 Imaging Detector
7 Bottom Aperture
8 Examined Specimen 9 Optional Pumping Port
10 Electron Beam Scan Angle
11 Electrical for Detector Bias and Collector
12 Working Distance
13 Sample Holder
14 Middle Aperture

DETAILED DESCRIPTION

Figure 1:
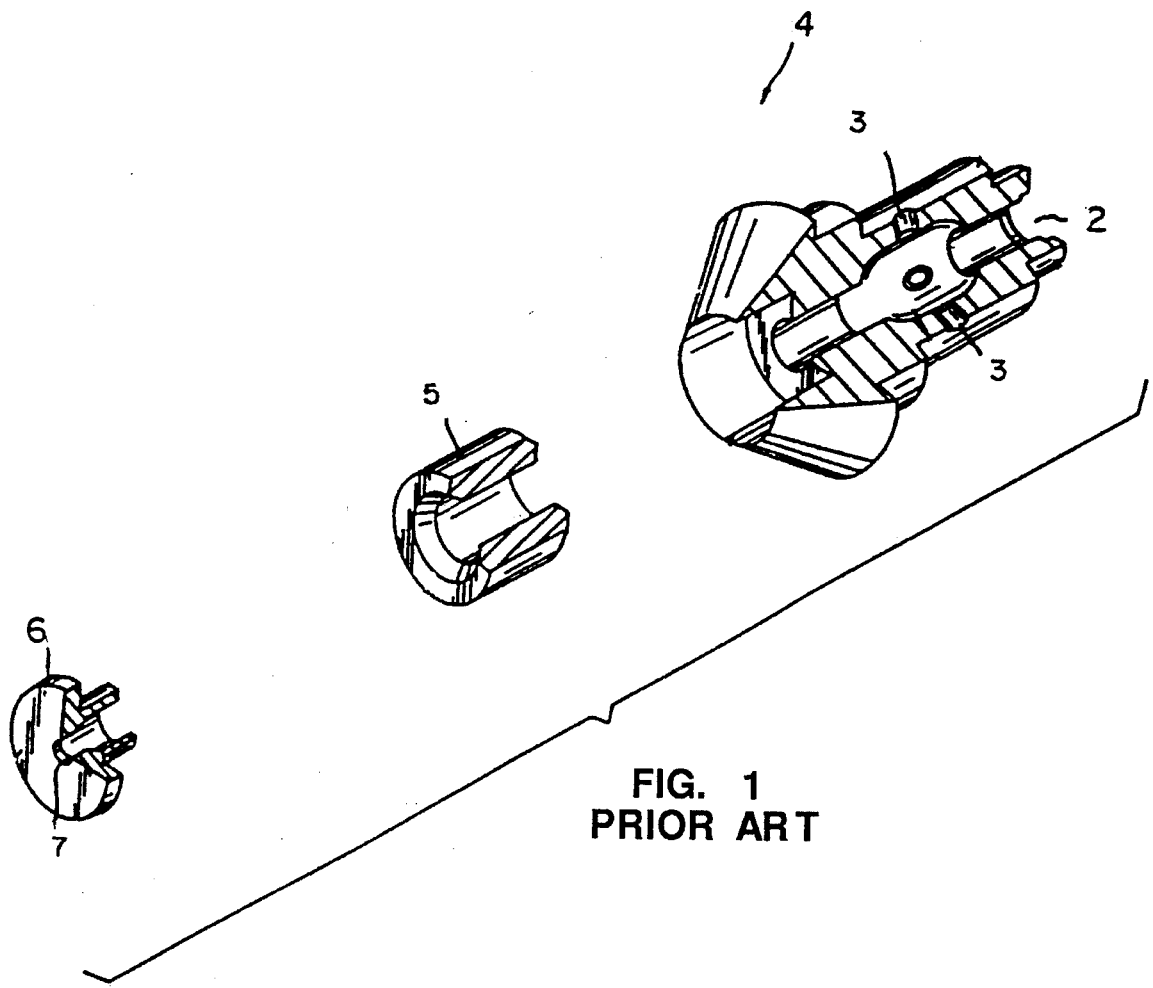
Figure 2:
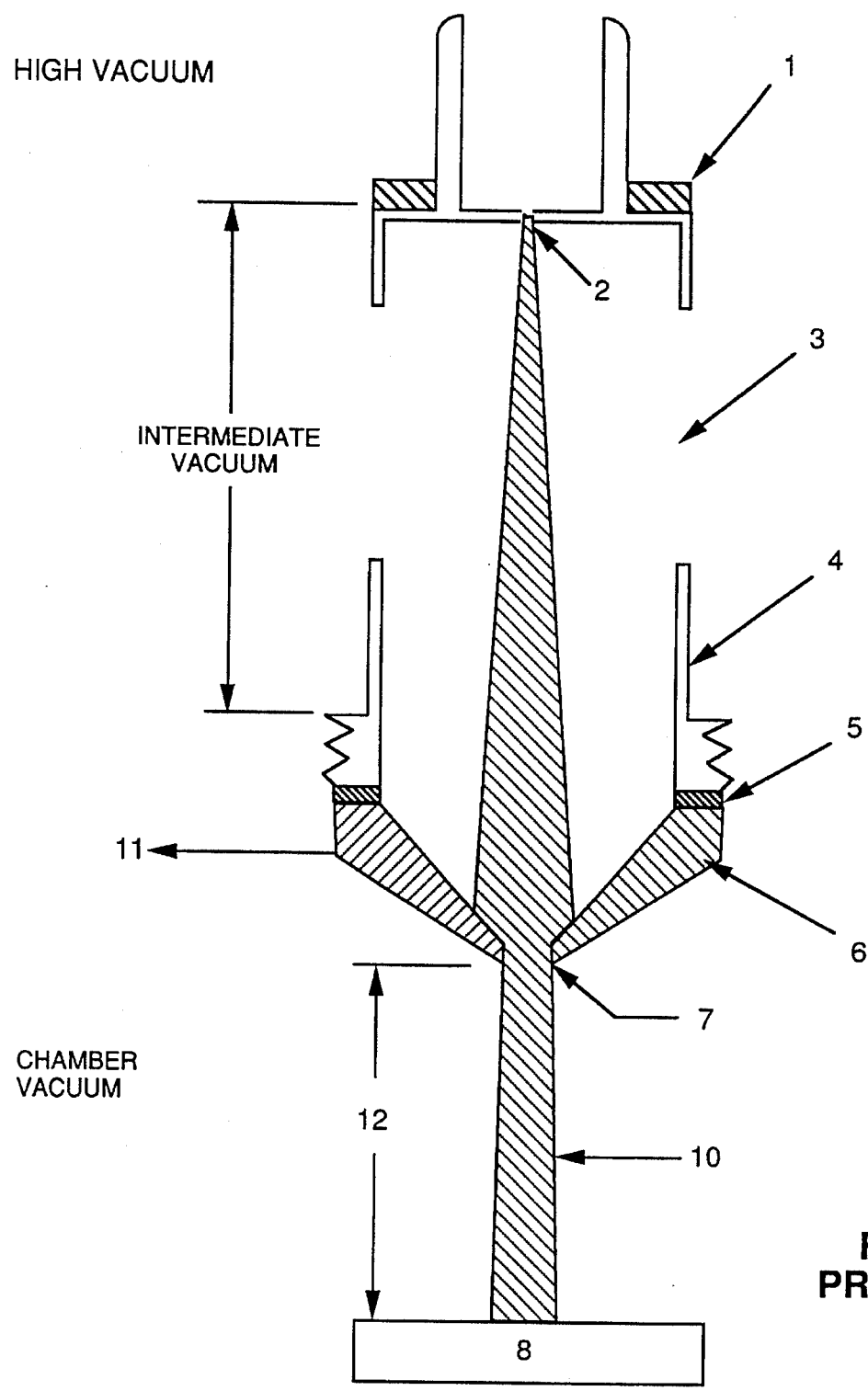

FIGS. 1 and 2, (Prior Art), show the differential pumping electron detector assembly within a vacuum chamber of an ESEM in which the present invention modifies and improves upon. Held within the assembly are two apertures for differential pumping. The top aperture 2 is approximately 300 microns. The bottom aperture 7 is incorporated into the electron detector 6. This bottom aperture 7 is between about 0.5 mm to 2.0 mm. When the bottom aperture 7 is greater than 2.0 mm, vacuum within the ESEM chamber degrades dramatically. For example, when the aperture is 0.5 mm, a pressure of 20 torr can be maintained. When the aperture is 2.0 mm, less than 5 tort pressure can be maintained with a minimum magnification of 40X in typical existing ESEM apparatus. Slightly lower magnifications can be achieved by increasing the working distances of prior type ESEM devices by doubling the distance, e.g. typically an increase in the working distance of existing units from 38 mm up to 70 mm will lower the magnification power to the 25X–30X range. This limits the degree of allowable lower magnification without undue signal degradation of the specimen under examination by the ESEM apparatus. The improvement presented herein allows magnification down below 20X without vacuum failure at a comparable 34 mm range without an increase of the working distance.

Figure 3:
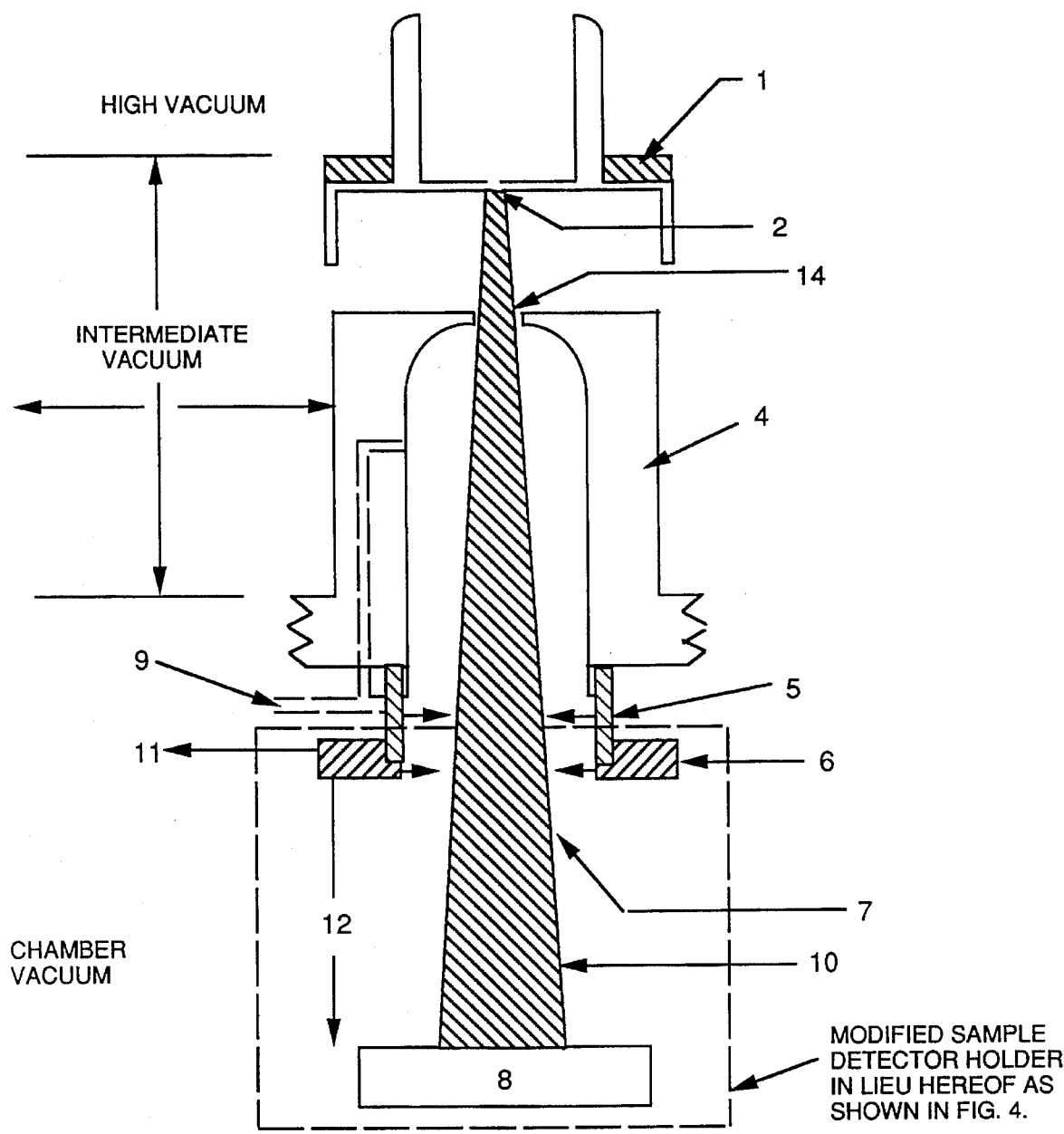
FIG. 3 shows the improved aperture carrier and electron imaging detector assembly which allows for low magnification capabilities in ESEM apparatus.

FIG. 3 shows the improved aperture carrier and electron imaging detector assembly which allows for lower magnification capabilities. The assembly comprises a body 4 made of an electrically conductive material. A teflon washer, O-ring or other gasket material 1 is used to seal the higher vacuum chamber from the intermediate vacuum zone. Within the body 4 are at least three apertures. The upper aperture 2 is used to allow passage of an electron beam while being small enough to prevent degradation of the Higher Vacuum Zone, similar in purpose to that discussed in the prior art. The middle aperture 14 is placed at a distance from the upper aperture 2 so as not to restrict the scan angle 10 of the electron beam. At the same time, the middle aperture 14 is sized so as not to allow the intermediate vacuum to degrade due to a higher chamber pressure. Sizes of this middle aperture range between 0.1 to 1.5 mm diameter. Smaller diameters are desired to maintain vacuum integrity.

A combination insulator 5 and bottom aperture 7 are used to attach the electron detector 6 to the body 4 and also provide an exit point for the electron beam 10 within the body 4 prior to impinging upon sample 8. The gas limiting aperture assembly comprises the insulator 5 and the detector 6. This arrangement allows for a shorter working distance 12 for the same magnification when compared to existing ESEM apparatus which in turn allows for lower magnification capabilities of a specimen. An optional modification of the body 4 includes a pumping port 9 may be a part of the body 4 and/or the insulator 5 for differing pressures between the middle aperture 14 and bottom aperture 7.

The electron detector 6 in a secondary electron gaseous detector can be connected externally to standard electronic circuitry through a connection 11 in a well known manner as taught in U.S. Pat. No. 4,785,182. The detector 6 has been improved so as to allow better signal to noise in the detected signal from the specimen under examination. This design allows for scanning of the electron beam without interference. Moreover, in other types of electron microscope apparatus, the detector can be a backscatter detector, a cathode luminasconce detector or an Everhard-Thornley secondary electron detector.

Consequently, no electrons are detected as they come down through the detector 6 to the specimen 8. This eliminates extraneous signal to the detector 6 and lowers the noise received in the detection signal. This design also allows for larger detectors to be used thereby improving the signal to noise ratio of a detected signal. The detector 6 can also be removed from the insulator and placed at other locations without interfering with a required vacuum condition within the EH apparatus such that the gas limiting aperture assembly would comprise the insulator 5 alone.

Another embodiment of the invention includes a variable gas limiting aperture assembly of the bottom aperture 7 by varying the opening size of either insulator 5 and/or detector 6. This feature allows for optional pumping port 9 that allows for effective change of the pressure between middle aperture 14 and aperture 7. The top aperture 2 would remain unchanged. The variable gas limiting aperture assembly with bottom aperture 7 can be changed with or without opening the specimen chamber. Remote changing of the bottom aperture 7 size in the radial opening can be accomplished by a variable shutter assembly such as that used in a camera lens, a multiple aperture strip or wheel; or a suitable mechanical, hydraulic, electrical or pneumatic radial displacement device.

Figure 4:
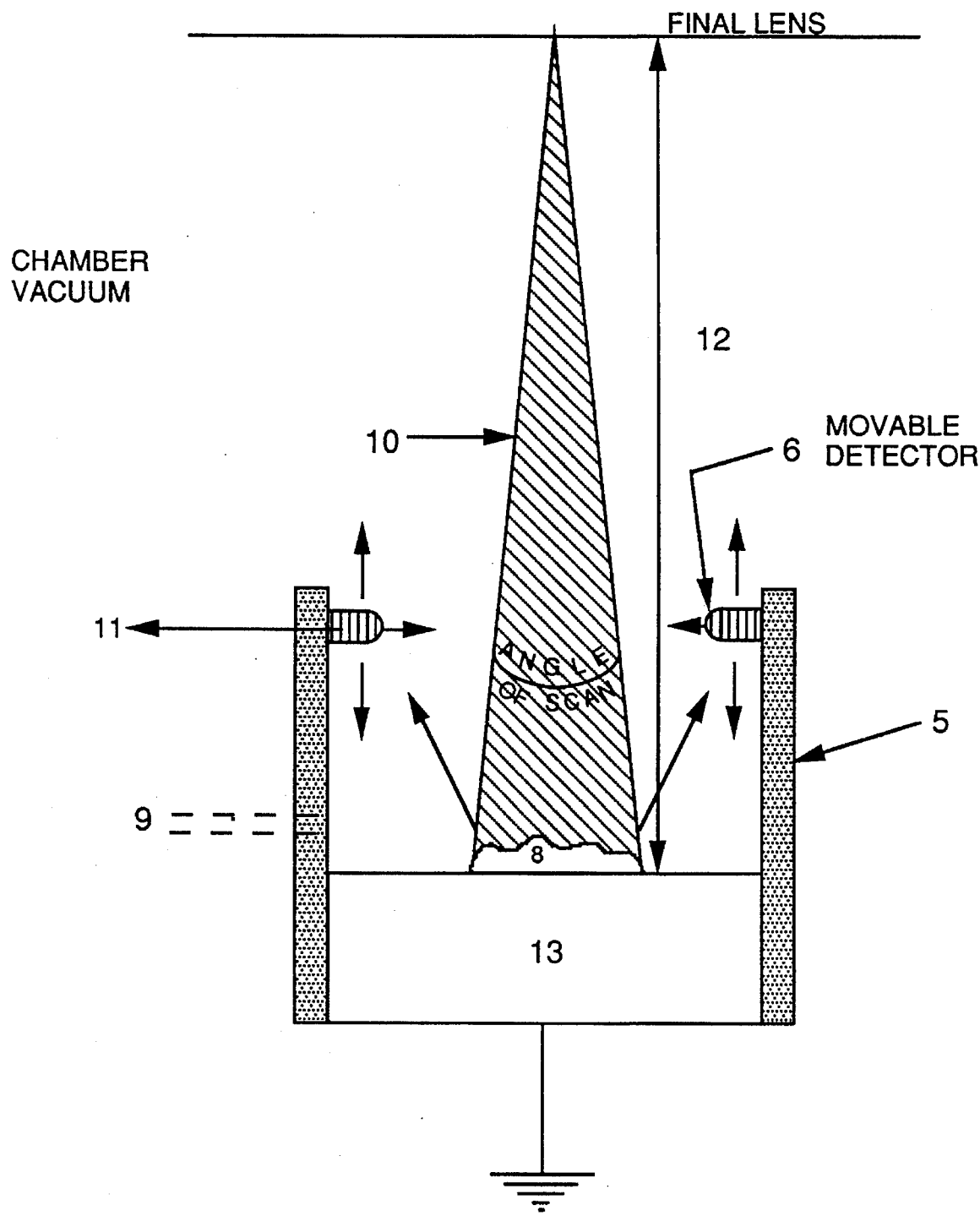
FIG. 4 shows an additional embodiment of the invention of a variable displacement mount for holding the sample using a piston design which allows the detector to be variable with respect to the sample which can also be part of the assembly shown in FIG. 3.

FIG. 4 is another embodiment of the invention which allows for the detector 6 to be at a remote location for better signal detection capability. The prior art keeps the detector 6 on at a fixed single location at the top of the specimen chamber. As the working distance 12 increases, the ability of low energy electrons to reach the detector 6 decreases. By using a movable detector positioned within a close proximity of the specimen 8 and sample holder 13, greater collection efficiency results. Very long working distances 12 can allow for low magnifications of the order of less than 15X. In either case, the sample holder 13 can be long working distances for lowest magnification or shorter working distances for best resolution. The present invention has only moderate affect on the resolution despite the longer path the primary electrons must travel in a vacuum of higher pressure. The location of the detector 6 can be varied with respect to the specimen 8 by translation sideways if positioned on the top of the holder 13, and below or above the specimen 8 when longitudinal displacements are required.

MODE OF OPERATION

The preferred method of operation is dependent on the specimen examined. Most specimens can be examined in vacuums of 1–10 torr using accelerating voltages of 5–30 kV. Lower magnifications can be achieved at lower accelerating voltages. For example, at 30 kV, low magnifications are of the order of 25X with a 38 mm working distance. At 10 kV with the same working distance, magnifications of less than 15X are achievable. The electron beam using the improved aperture assembly can operate with an energy in the range from about 100 electron-volts to 100 kilo-electron-volts at gaseous pressure within a range from about $10^{-7}$ torr to about 25 torr with an electric field in the detector biasing potential can be up to 2 kilovolts.

Although the description above contains many specificities, these should not be construed as limiting the scope of this invention but as merely providing illustrations of some of the presently preferred embodiments of this invention.

I claim:

1. In an environmental scanning electron microscope (ESEM) with specimen chamber with means for evacuation of the specimen chamber comprising:

a conduit through which an electron beam passes, the conduit bound by a series of annular restrictions with apertures with means for sealing the annular restrictions thereby defining a series of pressure chambers through which the electron beam passes;

means for evacuating the series of pressure chambers; and a bottom annular aperture carrier body, which is one of the pressure chambers, with a coaxial bottom aperture assembly with a bottom aperture that allows passage of the electron beam from the conduit to the specimen chamber;

wherein the improvement comprises at least three intermediate pressure limiting apertures in the bottom aperture carrier body, the bottom aperture including i) an upper sealed annular portion and ii) a substantially open annular portion in relation to the bottom annular aperture carrier body;

whereby lower magnification capability results with better signal-to-noise ratio of a specimen's detected signal.

2. The electron microscope of claim 1 wherein the improvement's bottom aperture further including a detector which is substantially aligned therewith.

3. The electron microscope of claim 2 wherein the detector is a backscatter detector.

4. The electron microscope of claim 2 wherein the detector is a cathode luminescence detector.

5. The electron microscope of claim 2 wherein the detector is an Everhart-Thornley secondary electron detector.

6. The electron microscope of claim 2 wherein the bottom aperture assembly further including a means for varying an opening size of the bottom aperture thereby effecting desirable pressure changes between the series of pressure chambers through which the electron beam passes.

7. The electron microscope of claim 1 wherein the improvement's bottom aperture does not include an integral detector.

8. The electron microscope of claim 7 wherein the bottom aperture assembly further including a means for varying an opening size of the bottom aperture, thereby effecting desirable pressure changes between the series of pressure chambers through which the electron beam passes.

9. The electron microscope of claim 1 wherein the improvement further including a cylinder-piston structure in the evacuated specimen chamber for varying a longitudinal distance between the examined specimen and the bottom aperture, the specimen is disposed on an insulated movable piston of the cylinder-piston structure, thereby effecting a desirable working distance.

10. The electron microscope of claim 1 wherein the means for evacuation of the specimen chamber has a capacity for maintaining pressure between $10^{-7}$ torr to about 25 torr.

11. In a method of generating, amplifying and detecting secondary electrons from a surface of a specimen in a gaseous electron microscope apparatus with steps comprising:

scanning the surface of the specimen under suitable pressure with a primary electron beam having sufficient energy that causes emission of secondary electrons from the surface of the specimen;

accelerating the secondary electrons with an electric field of sufficient strength so as not to induce catastrophic electrical discharge and arcing;

detecting electrical current proportional to the number of secondary electrons emitted from the surface of the specimen by a detection means, the detection means is coextensive and coaxial with an open bottom aperture thereby leaving an unobstructed passage for the primary electron beam through a sealed annular structure when observed normal to the primary electron beam;

wherein the improvement comprises varying a relative position of the specimen with respect to the detection means comprising: said sealed annular structure that has a sealed upper annular portion juxtaposed to the bottom aperture, thereby effecting lower magnification capabilities without change in resolution of the specimen's image at lower magnifications that are less than 100X magnification.

12. The improvement of claim 11 wherein varying the relative position of the detection means with respect to the specimen is by longitudinal displacement between the specimen and the detection means, thereby modifying a working distance.

13. The improvement of claim 11 wherein the method further including maintaining an energy of the electron beam in a range between 100 eV and 100 KeV.

14. The improvement of claim 11 wherein the method further including maintaining a gaseous pressure in a range between $10^{-7}$ torr and 25 torr.

15. The improvement of claim 11 wherein varying the relative position of the detection means with respect to the specimen is by varying an annular radial displacement, thereby effecting a camera shutter action.

16. In a method of generating, amplifying and detecting secondary electrons from a surface of a specimen in a gaseous electron microscope apparatus with steps comprising:

scanning the surface of the specimen under suitable pressure with a primary electron beam having sufficient energy that causes emission of secondary electrons from the surface of the specimen;

accelerating the secondary electrons with an electric field of sufficient strength so as not to induce catastrophic electrical discharge and arcing;

detecting electrical current proportional to the number of secondary electrons emitted from the surface of the specimen by a detection means;

wherein the improvement comprises varying a relative longitudinal position between the specimen and the detection means whereby the working distance is modified allowing for lower magnification capabilities without change in resolution of the specimen's image at lower magnifications less than 100X magnification.

17. The improvement of claim 16 further including the step of maintaining an energy of the electron beam in a range between 100 ev and 100 KeV.

18. The improvement of claim 16 further including the step of maintaining a gaseous pressure in a range between $10^{-7}$ torr and 25 torr.

* * * * *